United States Patent [19]
Kunert

[11] Patent Number: 5,128,181
[45] Date of Patent: Jul. 7, 1992

[54] CONSTRUCTION ELEMENT

[76] Inventor: Heinz Kunert, Am Krieler Dom 23, 500 Köln 41, Fed. Rep. of Germany

[21] Appl. No.: 476,037

[22] Filed: Feb. 7, 1990

[30] Foreign Application Priority Data

Feb. 7, 1989 [DE] Fed. Rep. of Germany ....... 3903521

[51] Int. Cl.$^5$ .......................... E06B 3/24; H01L 6/00; F25B 29/00
[52] U.S. Cl. ...................... 428/34; 428/192; 428/913; 52/788; 52/789; 136/244; 136/251; 136/258; 437/1; 429/160; 429/148; 429/163; 429/164; 126/443; 126/446; 126/450; 165/48.2; 357/30
[58] Field of Search ............. 428/34, 192, 913, 45, 428/119, 120, 188, 364, 398; 156/107, 609; 52/171, 172, 788, 789, 790; 427/74, 34; 136/243, 244, 249, 251, 252, 258; 437/1, 4, 5; 429/100, 148, 163, 164, 167, 168; 126/442, 443, 445, 446, 417, 434, 450; 165/48.2, 15, 32; 357/30

[56] References Cited

U.S. PATENT DOCUMENTS

| 3,903,665 | 9/1975 | Harrison | 52/171 |
| 4,137,098 | 1/1979 | Field | 52/423 |
| 4,249,958 | 2/1981 | Baudin et al. | 150/107 |
| 4,607,132 | 9/1986 | Jarnagin | 427/74 |

Primary Examiner—Ellis P. Robinson
Assistant Examiner—Donald J. Loney
Attorney, Agent, or Firm—Sixbey, Friedman, Leedom & Ferguson

[57] ABSTRACT

The element according to the invention consists in a preferred embodiment of two panes (10, 12) assembled in the manner of a composite or laminate pane, a thermally insulating layer, for example an air or inert gas layer, formed between said panes, and a sheet-like photovoltaic unit (18) which is arranged between the one pane (10) and the thermally insulating layer and which can consist of a transparent semiconductor material. By this configuration of the element the solar energy is optimally available as light and thermal energy in accordance with its spectral distribution and after conversion by the photovoltaic element also as electrical energy.

21 Claims, 2 Drawing Sheets

CONSTRUCTION ELEMENT

The present invention relates to a construction element for use as a window, an upright or sloped wall member or a parapet or sprendel element, which can contribute to the room heating in building. A conversion of solar energy to a more valuable energy form, that is electrical energy, is hitherto not possible with conventional construction elements. Fundamentally, however, solar energy can of course be converted to electrical current via the photovoltaic effect.

However, photovoltaic cells or elements have a very restricted efficiency. Although the incident solar radiation is almost completely absorbed, the absorbed solar energy can only be converted to electrical energy to a small percentage of about 5 to 15 %. The greatly predominant part of the solar energy is converted to thermal energy and uselessly dissipated to the surroundings by convection, radiation and thermal conduction.

Due to the limited conversion efficiency the obtainable electro-energy yield rate of photovoltaic elements per unit area is small and consequently, in view of the high production costs of such elements, their use for recovering electrical energy at approximately competitive prices within the framework of already existing systems of electrical power supply will no doubt remain unprofitable even in the remote future.

Another aspect here is the unfavorable general energy conversion balance in the production of photovoltaic cells or elements. The manufacturing process requires more primary high-quality and unrecoverable energy than the cells are able to generate in the course of their life. This is particularly true when not only the functional semiconductor layers but also the support and cover plates and the frames and frame structures are included in the production costs. The use of photovoltaic elements for relieving the energy balance of a building will thus not appear advisable from the energy and economic aspect until a way has been found of integrating the elements into the structural body in such a manner that with their aid a broad spectrum of additional benefit can be obtained.

The present invention provides a construction element which enables the use of available photovoltaic cells as building components with convincingly positive, ecological but also economic balance. This is to be achieved substantially by two measures:

1. By designing photovoltaic elements in such a manner that they can be used like conventional building material or instead of conventional building components. In this way, said costs of the enclosure plates, the framing and the support structure can be compensated, as can however also those of the areas occupied.
2. By employing specific arrangements of the elements within the framework of the building components to supply the energy fraction of the incident solar energy radiation not transfored to electrical energy but collecting as thermal energy and otherwise uselessly lost to the building in the heating period to relieve the heating energy requirement but on the other hand in the summer period keeping this resulting thermal energy and at the same time the solar radiation incident on the outer surfaces of the building away from the building interior to reduce the amount of cooling load required.

Finally, the inventive idea solves the problem of employing the solar energy spectrum incident on the outer surfaces of a building in the form of direct or diffuse radiation under economical conditions for the energy supply of the building. Advantageously, for generating prime electrical energy priority is given to the fraction of the solar radiation corresponding to the particular efficiency of the photovoltaic elements employed. The greater part of solar energy radiation which when using photovoltaic cells is generally not utilizable and remains of the order or magnitude of about 90% is used in the heating period almost completely for heating the building, outside the heating period kept away from the interior of the building to reduce cooling costs incurred and when using partially transparent photovoltaic elements if desired supplied in corresponding proportions to the building interior as light radiation.

Due to this versatile utilization the cost-benefit function of photovoltaic cells can be positively configured and they can be assisted on the their way to broad market penetration. Due to the almost complete energetic utilization of the incident solar radiation and the use of existing building element structures (frame, panes, seals, etc.) the previous cost-performance ratio, with respect to the already achieved energy conversion rate (DM per Watt), taking account of the area relation (DM per $m^2$), will no doubt assume values which as regards the energy supply of buildings permit an economic use compared with other ecologically dubious energy sources.

For implementing the invention means and techniques known per se can be combined. The previously employed photovoltaic elements are divided into two systems. On the one hand there are mono or polycrystalline semiconductor layers and on the other amorphous films of semiconductors applied to support plates and coated with a protective foil highly transparent to solar radiation. If a glass sheet is employed as support plate and as protective foil the elements may be made in the form of a laminated sheet.

A further distinguishing feature of photovoltaic elements is their partial transparency for the visible range or for the near infrared range. Amorphous systems have in this range a transmission rate of 10 to 15 %. For solar radiation transmission such elements prove to be isotropic. Fundamentally, mono and polycrystalline systems can also be made partially transparent, with certain losses in efficiency. However, in present constructional forms they are opaque.

In accordance with the invention, the use of such elements as surrounding surfaces in buildings is contemplated, in particular as window, sprendel or wall elements. For this purpose it is first proposed to use glass sheets for the support and cover plates of the semiconductor coatings. In this manner the elements are obtained as stable laminated glass panes. In accordance with the requirements of thermal insulation in the building art it is further proposed to construct the laminated glass panes made in this manner each with a further glass sheet to give double-pane high-performance insulating glass systems of fundamentally known type, in particular with a low-E covering applied preferably to the inner surface of the composite or laminate glass pane and a gas filling of the sheet intermediate space reducing the thermal conduction.

With external positioning of the photovoltaic composite or laminate glass pane an insulating glass element is obtained with highly efficient solar screening function. The inner side emission-reducing coating of the laminated glass pane acting as absorption sheet prevents heat radiation on the side of the room.

Photovoltaic insulating glass elements in the constructional form described already represent a solution of the above problem as regards the economic integration of photovoltaic cells into the building. In accordance with the further problem of supplying the excess thermal energy absorbed by said elements and not converted to electrical energy if necessary, i.e. in the heating period, to the room interior as completely as possible for relieving the heating load, it is further proposed according to the invention to mount such insulating glass elements integrated into the building in reversible or turnable frame structures of basically known type. Such frame structures permit repositioning of outwardly directed panes of insulating glass elements towards the inside and vice-versa.

In the summer period the photovoltaic element or cell made up in the form of a laminated glass pane remains in the outer position. The excess solar radiation energy converted to thermal energy is, in this position, largely dissipated outwardly by convection or radiation. The heat transfer into the room interior is largely prevented by the rear emission-reducing coating of the laminated pane and by the air volume located between the panes of the insulating glass system.

On the other hand, in the heating period the photovoltaic laminated glass element in positioned towards the room interior. The air volume then disposed towards the outside and the correspondingly positioned low-E covering are then able to eliminate heat losses of the laminated glass element to the outside. The excess thermal energy of the solar radiation now incident on the reverse side of the element then benefits the room heating overproportionally to a great extent. The solar radiation losses due to the outer pane can be restricted to an amount of about 8% by using highly transparent glass panes with reduced iron oxide content.

The concept according to the invention for solving the problem described at the beginning is thus based on the idea of constructing photovoltaic elements as highly insulating wall components and thermal insulating media such as air volumes and thermally reflecting layers transparent with respect to the solar radiation spectrum are employed and in summer are arranged towards the interior and in the heating period towards the exit area.

In preferred manner, this idea can be implemented by the following steps:

1. by embedding photovoltaic layers in a laminated glass pane with symmetrical structure and isotropic structure as regards the radiation transmission;
2. by incorporating such laminated glass panes as outer pane of a highly efficient two or more-pane insulating glass element;
3. by integrating said insulating glass element into a frame structure permitting rotation or turning of the element through 180°.

In the case where photovoltaic elements of asymmetrical structure and having an opaque carrier layer are used, i.e. which permit only a unilateral radiation access, to obtain an alternate arrangement of transparent thermally insulating media other constructional forms must be employed to obtain a functional product design.

It is proposed for this case to introduce such photovoltaic elements in sheet structure or as dimensionally stable plates into the intermediate space of a double-pane insulating glass element with the "radiation-open" surface facing the solar radiation source. They are suspended in the pane intermediate space displaceable parallel to the pane surfaces so that they can be applied or pressed controllably both to the outer pane and to the inner pane of the insulating glass element. This can be achieved by mechanical, magnetic or pneumatic guide or control systems.

The coupling and uncoupling of the photovoltaic plate element to the respective glass pane can be effected in extremely simple manner by a quasipneumatic system by forming between said plate element and the glass panes air-tight chambers and alternately evacuating them or subjecting them to compressed air.

It is additionally proposed to apply low-E coverings either to the inner surfaces of the glass panes or on both sides to the surfaces of the photovoltaic plate. In the summer position the photovoltaic plate bears on the outer pane of the insulating glass element. The absorbed excess thermal energy is then transmitted by thermal conduction directly to the outer pane and as in the case of the previously described embodiment dissipated there to the atmosphere by convection or radiation. The thermal radiation towards the room is suppressed by the low-E covering disposed on the inside; the heat transfer based on heat conduction is suppressed by the thermally insulating layer.

On the other hand, in the heating period the photovoltaic plate bears on the pane of the insulating glass element facing the interior. The excess thermal energy of the plate is then transferred by thermal conduction to said inner pane and from there supplied to the room interior by convection or thermal radiation. Due to the low-E layers now positioned on the reverse with respect to the photovoltaic plate only small thermal radiation losses to the outer atmosphere arise.

The dissipation of the excess heat loads absorbed by the photovoltaic elements in one direction in each case takes place as described by correspondingly positioning the thermally insulating layers either on the side of said elements facing the solar energy source or on the side remote therefrom. The respective unilateral dissipation of the heat loads can be further intensified by increasing the thermal resistance of said layers. For example, instead of the air volume an inert gas reducing the thermal conduction or absorbing the thermal radiation may be used. Evacuation of the pane interior would also have extremely advantageous effects.

In the embodiment first described, to increase the thermal resistances for the solar radiation highly transparent convection-reducing structure materials are advantageous. Particularly suitable for this purpose are capillary structures and so-called silica airogel structure materials.

In a third embodiment an only partial equipping of the insulating glass elements with photovoltaic layers in various configurations is proposed. Such elements would no doubt be particularly suitable for window structures and enclosure structures of storey-height.

Further features and advantages of the invention will be apparent from the following description of several embodiments and from the drawings to which reference is made and in which.

Figure 1:
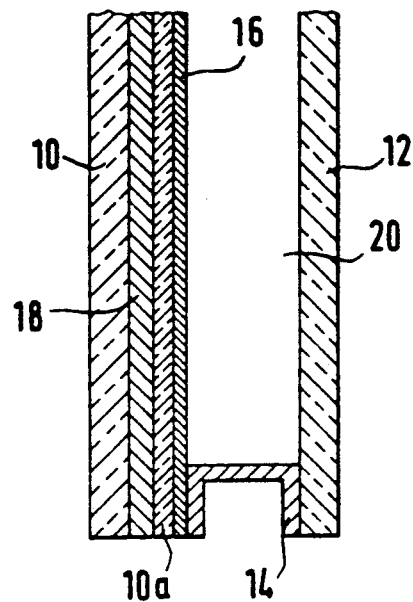
FIGS. 1 to 4 show several embodiments of the unit according to the invention in cross-section.

In the embodiment shown in FIG. 1 the window, wall, sloped or sprendel element consists of two transparent planes or plates 10, 12 in particular glass panes, arranged in the manner of double glazing spaced apart from each other. The two glass panes 10, 12 are held together in conventional manner by a spacer 14 of U-shaped cross-section. On the inner side of the glass plane 10 a sheet or plate-like photovoltaic unit 18 is mounted. Arranged on the unit 18 is a transparent pane or plate 10a. Said pane or plate 10a is provided on its surface facing the glass pane 12 with a low-E covering 16. The pane 12 also preferably has on its surface facing the unit 18 a low-E covering. Such a covering preferably comprises an emission coefficient of the order of magnitude of 0.06. The remaining space between the panes 10, 12 forms a thermally insulating layer 20 and is filled with air or preferably with an inert gas. The thermally insulating layer 20 may also be formed by evacuating the space between the panes 10, 12. The pane 10, the unit 18 and the pane or plate 10a are combined together in the manner of a laminated glass plate.

Depending on the purpose of the element the photovoltaic unit 18 is made from various materials. If the element is to be light-permeable an amorphous semiconductor material is preferably used. If the element can be opaque or only a low light transmission is allowed or required, the photovoltaic unit consists of poly or monocrystalline semiconductor material. In particular, isotropic material is used so that the radiation incidence of the front side leads to the same conversion efficiency as on the rear side.

Details of the photovoltaic unit will not be given here because said unit can fundamentally be made in conventional manner.

Figure 2:
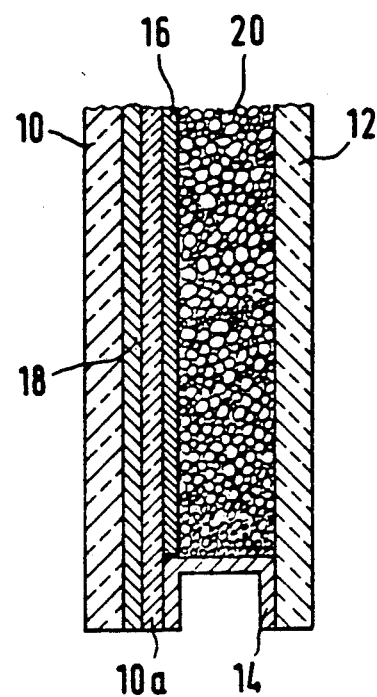

In the embodiment shown in FIG. 2 the space between the panes 10, 12 is filled with a structural transparent thermally insulating material. Such materials are fundamentally known, for example honeycomb, chamber and capillary structured materials of polycarbonate, polystyrene, polyamide and polyvinyl chloride. A material known under the name Aerogel is particularly suitable. Otherwise, the embodiment shown in FIG. 2 is identical to that of FIG. 1.

Figure 3:
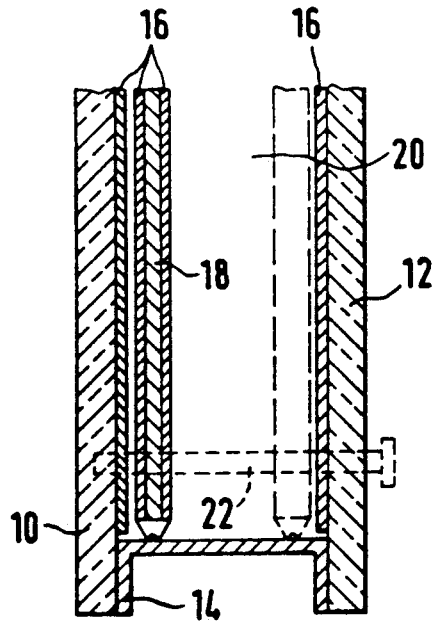
Figure 4:
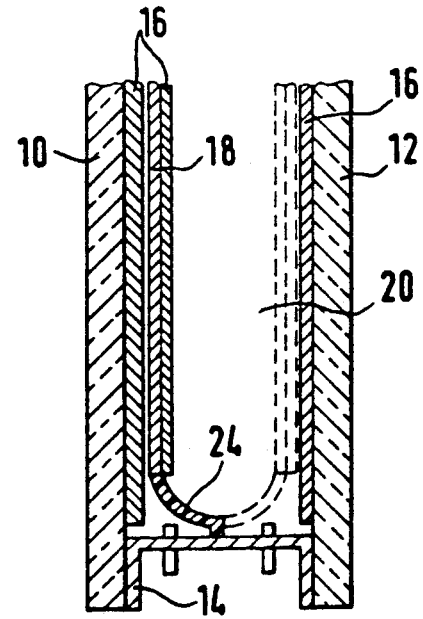

In the embodiment according to FIGS. 3 and 4 the photovoltaic unit 18 is arranged movably between the two sheets or panes 10, 12 which are provided on the inside with an emission-reducing low-E covering 16. By a suitable control means, the photovoltaic unit 18, preferably provided in this embodiment with a low-E covering on both sides, is brought selectively into contact with and applied to the inner side of the one or other pane 10, 12. In the embodiment according to FIG. 3, for this purpose guide rods 22 are provided which extend transversely of the photovoltaic element 18. In the embodiment according to FIG. 4 the photovoltaic unit 18 is provided with a flexible border mounting 24 via the outer edge of which it is secured to the spacer frame 14. In this embodiment the photovoltaic unit may form altogether a flexible sheet. Between the panes 10, 12 it separates two chambers and by selective acting on said chambers with a medium or evacuating said chambers the photovoltaic unit can be moved between the two panes 10, 12 and applied in each case to the inner surface of the respective panes.

Figure 5:
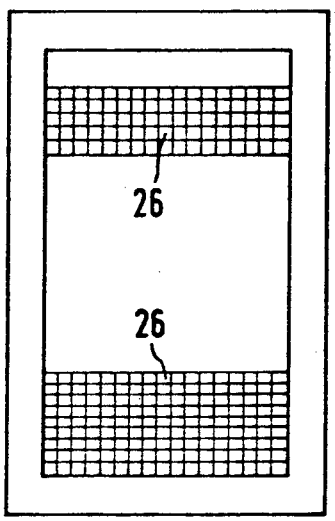
FIG. 5 is a plan view of another embodiment of the element according to the invention.

In the embodiment illustrated in FIG. 5 the element is not provided with a photovoltaic unit over the entire area but in the form of horizontal strips 26.

Figure 6:
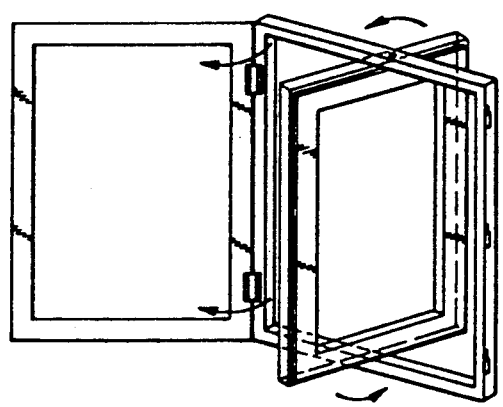
FIG. 6 is a schematic perspective view of a rotation window in which the unit according to the invention is used.

FIG. 6 shows an advantageous use of the element according to the invention in the form of any of the embodiments described in a window turnable about a centre vertical axis through 180° by rotation of a window leaf.

Figure 7:
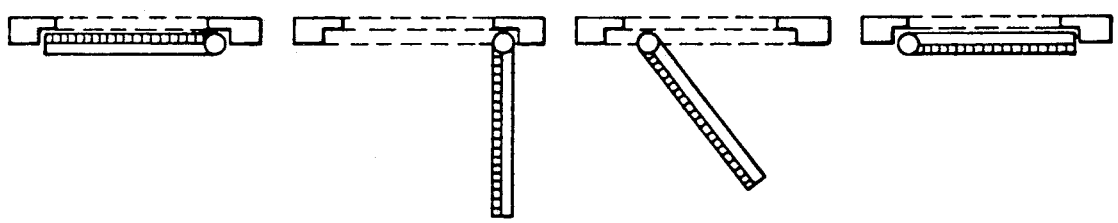
FIG. 7 shows schematic views of the various positions of the rotation window shown in FIG. 6 to explain the function thereof.

FIG. 7 shows schematically the turning of a window leaf through 180° by translational displacement of one of the side axes.

Figure 8:
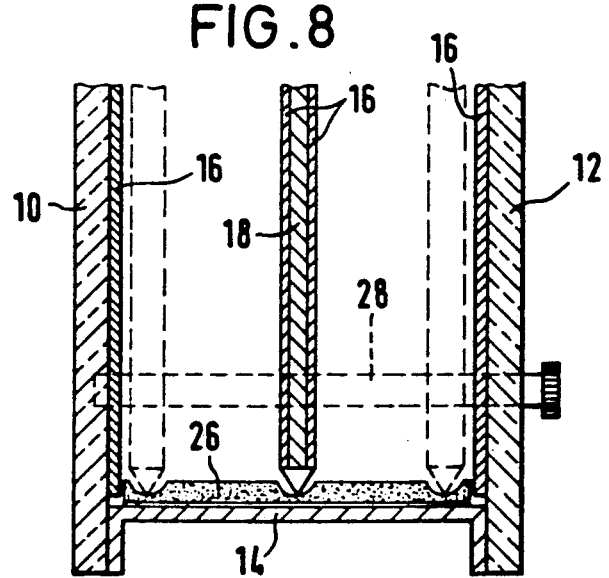
FIG. 8 is a partial section through a further embodiment.

The subject of the invention is also the window, wall, sloped or sprendel element shown schematically in FIG. 8. This element is constructed basically in the same manner as that according to the embodiment shown in FIG. 3 but has the additional peculiarity that the unit 18, apart from its end positions shown in dash line in engagement with the inner side of the pane 10 or 12, can assume intermediate positions, in particular a central position in which it divides the space formed between the panes 10, 12 into two separate substantially equisized chambers. The translational adjustment of the unit 18 may be made for example by means of a spindle drive which is only schematically indicated in FIG. 3 and denoted by the reference numeral 28. At the outer periphery the unit 18 is in sealing engagement via its edges with a sealing strip 26 of yieldable material. The chambers disposed on both sides of the unit 18 are thus sealed with respect to each other. The unit 18 can but need not be a photovoltaic unit. It may also be a plate which absorbs radiation in the solar spectrum and is preferably largely transparent for visible light. Preferably, the unit 18 is provided with an emission-reducing coating 16 on both sides.

The spacing of the panes 10, 12 from each other is about 30 mm.

The element according to the embodiment shown in FIG. 8 is distinguished by a regulatable U value, which means the heat flux through the element in Watt/m$^2$ and U. A two pane insulating glass element achieves U values down to 1.3 Watt/m$^2$U. Fundamentally, with insulating glazing the U value can be increased by increasing the distance between the panes. However, increasing the pane distance beyond about 15 mm does not lead to any further reduction of the U value because the heat resistance increasing with the thickness of the air or inert gas layer is cancelled out by the increase of the heat transfer by convection.

In contrast, in the embodiment described here by increasing the distance between the panes 10, 12 to about 30 mm a considerable reduction of the U value down to the order of magnitude of about 0.8 Watt/m$^2$U is achieved because the unit 18, when disposed centrally between the panes 10, 12, defines two equisized chambers each of about 15 mm thickness. In this position of the unit 18 the element behaves like a triple-glazed insulating glass element with in each case a 15 mm pane spacing.

The positioning of the unit 18 is controlled by a control mechanism in dependence upon parameters such as internal temperature, external temperature, radiation incidence from the outside and weather conditions. At night time or periods with low radiation incidence the unit 18 is brought into the centre position shown in FIG. 8. During the heating period, when a utilizable solar radiation is incident, the unit 18 is brought to bear on the inner side of the pane facing the building interior. When in the summer period penetration of the solar radiation into the building interior is to be restricted, the unit 18 is moved into engagement with the inner side of the pane remote from the building interior.

A further interesting aspect of the invention resides in that the emission-reducing coating 16 which in all the embodiments described is preferably present also on the inner side of the pane facing the building interior is used as electrical heating resistance. Common low-E coverings have an ohmic specific area resistance which is of the order of magnitude of a few Ohm/m$^2$ so that for heating purposes supply voltages can be applied which are of the order of magnitude of the mains AC voltage and can also be generated by series connection of a plurality of photovoltaic elements. It is therefore provided in further development of the invention to utilize the electrical energy generated by the photovoltaic unit 18 to feed an electrical heating resistance which is formed by the emission-reducing coating on the inner side of the pane facing the room interior. The peculiarity of this form of utilization of the electrical energy generated by the photovoltaic unit 18 resides in that the pane facing the room interior is brought by the additional heating to a temperature which is substantially equal to the room temperature. This gives the following advantages: Firstly, no additional heating element is required. It is already available with the emission-reducing coating of the glass pane facing the room interior. By heating the pane facing the interior to room temperature the thermal transmission losses are compensated. Throughout the entire daytime of the heating period a thermally neutral wall area is achieved having practically a U value of 0 Watt/m$^2$U. The energy load for heating the pane to room temperature is very small because only the loss rate of the heat flux of the insulating glass element need be compensated. The energy expenditure thus corresponds to the U value of the insulating glass element. At a U value of the insulating glass element of 1.3 Watt/m$^2$U it is therefore 1.3 times the difference between the inner and outer temperature. This small energy amount to be supplied to the inner pane already however leads to the advantage of comfortable utilization of the space near the window because radiation losses, like thermal transmission losses altogether, through the window are thereby avoided. With relatively low energy expenditure the heat flow outwardly is therefore suppressed.

It is further provided to supply the electrical heating resistance thus available at times of low solar radiation and at night time during the heating period from the alternating current network of the building when required.

If the pane facing the building interior is already heated by solar radiation to room temperature or above or if the photovoltaic unit 18 supplies during the day more electrical energy than required to heat the pane to room temperature, via a suitable temperature-controlled regulation the excess energy can be stored in an accumulator to be available at times with lower solar radiation, in particular at night.

It is further provided to supply the electrical heating resistance available in the pane element at times of low solar radiation and at night in the heating period from the alternating current network of the building. It is then advantageous to use the existing resistance heating for the room heating in general by applying higher temperatures, i.e. for example for compensating ventilation losses. This saves costs and space requirement for a heating system which always has to be provided even with high solar conversion efficiency and in addition the thermal benefit and comfort of a large-area flexible radiation heating are gained. In a manner highly efficient from the energy point of view the mains supply could then be switched as required in a compensating manner with respect to the incident solar radiation energy.

I claim:

1. A construction element having a first transparent pane, a second transparent pane spaced from said first pane in parallel relationship thereto and an intermediate sheet member located between said first and second panes and constituting a photovoltaic unit, said intermediate sheet having two opposed major faces each provided with a low-emission coating, and said intermediate sheet member being movable between a first position contacting an opposed inner face of said first pane and a second position contacting an opposed inner face of said second pane.

2. The element according to claim 1, wherein said photovoltaic unit comprises a polycrystalline or monocrystalline semiconductor material.

3. The element according to claim 1, wherein said photovoltaic unit comprises an amorphous semiconductor material.

4. The element according to claim 1, wherein both of said first and second panes have an inner major face provided with a low-emission coating.

5. The element according to claim 1, wherein said intermediate sheet member is suspended by means of a flexible edge suspension between the two panes.

6. The element according to claim 5, wherein said intermediate sheet member is movable between said first and second panes and selectively applicable to an inner face of each pane by selectively subjecting the space defined between said intermediate sheet member and one of said panes to one of gas pressure and depression.

7. The element according to claim 1, further comprising control means for controlling the setting of said intermediate sheet member between said first and second panes depending upon parameters selected from a group consisting of internal temperature, external temperature, radiation incidence from the outside, and weather conditions.

8. The element according to claim 4, wherein at least one of said low-emission coatings forms a resistance heating element.

9. The element according to claim 8, wherein said photovoltaic unit generates electrical energy supplied at least partially to said resistance heating element.

10. The element according to claim 9, further comprising pane temperature control means for controlling electrical energy generated by said photovoltaic unit and supplied to said resistance heating element so that the temperature of the associated pane is at least approximately equal to the temperature in a room adjacent to said pane.

11. The element according to claim 1, wherein said sheet member is adapted to be adjusted to a position intermediate said first and second panes in spaced relationship from both of said panes.

12. A construction element having a wing mounted in a frame and a glazing structure mounted in said wing, said glazing structure comprising a first transparent pane, a second transparent pane spaced from said first pane in parallel relationship thereto and an intermediate sheet member located between said first and second panes and constituting a photovoltaic unit, said intermediate sheet having a first major face contacting an opposed inner face of said first pane and a second major face spaced from said second pane and provided with a low-emission coating, and said wing being turnable by 180° relative to a central axis with respect to said frame.

13. The element according to claim 12, wherein said photovoltaic unit comprises a polycrystalline or monocrystalline semiconductor material.

14. The element according to claim 12, wherein said photovoltaic unit comprises an amorphous semiconductor material.

15. The element according to claim 12, wherein said second pane has a low-emission coating on its face opposite said intermediate sheet member.

16. The element according to claim 12, wherein the space between said second pane and said sheet member is filled with a transparent material of low thermal conductivity.

17. The element according to claim 12, wherein said transparent material has a capillary structure.

18. The element according to claim 12, wherein said transparent material consists of a silica airogel structured material.

19. The element according to claim 12, wherein said sheet member is secured to said first pane on both sides by a transparent adhesive film adhesive.

20. The element according to claim 12, wherein said photovoltaic unit comprises a semiconductor material laminated between two panes and bonded thereto.

21. The element according to claim 12, further including means for fixing said wing in one of a first and a second position, the wing having a closed relationship with said frame in each of said first and second positions, the first and second positions being 180 degrees apart with respect to a central axis of said frame, whereby said glazing structure may be closed to face in either of two opposite directions.

* * * * *